United States Patent
Sarno et al.

(10) Patent No.: US 6,498,728 B1
(45) Date of Patent: Dec. 24, 2002

(54) SIMPLIFIED MODULAR STRUCTURE

(75) Inventors: Claude Sarno, Etoile S/Rhone (FR); Henri Bouteille, Beaumont les Valence (FR)

(73) Assignee: Thomson-CSF Sextant, Velizy Villacoublay (FR)

( * ) Notice: Subject to any disclaimer, the term of this patent is extended or adjusted under 35 U.S.C. 154(b) by 0 days.

(21) Appl. No.: 09/674,283

(22) PCT Filed: Apr. 20, 1999

(86) PCT No.: PCT/FR99/00935

§ 371 (c)(1),
(2), (4) Date: Oct. 30, 2000

(87) PCT Pub. No.: WO99/56514

PCT Pub. Date: Nov. 4, 1999

(30) Foreign Application Priority Data

Apr. 28, 1998 (FR) .............................................. 98 05323

(51) Int. Cl.[7] .............................. H05K 1/00; H05K 5/00; H05K 9/00
(52) U.S. Cl. ........................ 361/752; 361/753; 361/686; 361/816; 361/788; 174/35 R; 174/35 GC; 174/66; 220/4.33
(58) Field of Search ................................. 361/600–742, 361/747–759, 784–818; 174/35 R, 35 GC, 35; 211/41.11–41.18; 206/701–709; 339/45, 65; 439/259–260, 376, 377, 692; 220/4.33

(56) References Cited

U.S. PATENT DOCUMENTS

| | | | | | |
|---|---|---|---|---|---|
| 4,988,577 A | * | 1/1991 | Jamieson | ..................... | 428/573 |
| 5,595,316 A | * | 1/1997 | Gallarellit | ................... | 220/4.33 |
| 5,929,377 A | * | 7/1999 | Hamilton | .................. | 174/35 R |

* cited by examiner

Primary Examiner—David Martin
Assistant Examiner—Michael L. Lindinger
(74) Attorney, Agent, or Firm—Oblon, Spivak, McClelland, Maier & Neustadt, P.C.

(57) ABSTRACT

A modular structure for carrying a printed circuit board, having to be connected to an electronic installation. The modular structure includes two cover plates opposite each other, contributing to defining a housing for at least one printed circuit board. The cover plates engage one another by sandwiching, via a first edge, a support for one or more connection blocks for the connection and, via a second edge, a support for a locking mechanism in order to hold the structure in a connected position. The support for the locking mechanism and for the connection blocks have ends which are separate before the assembly of the cover plate. Such a modular structure may find particular application to electronic installations of the integrated modular avionics type.

20 Claims, 3 Drawing Sheets

SIMPLIFIED MODULAR STRUCTURE

BACKGROUND OF THE INVENTION FIELD OF THE INVENTION

The present invention relates to a modular structure designed to accommodate one or more printed circuit boards and having to be connected to an electronic installation.

DISCUSSION OF THE BACKGROUND

It is applicable especially but not exclusively to electronic installations of. the integrated modular avionics type, located on-board aircraft where they are likely to be subjected to harsh environmental conditions such as vibrations, sudden accelerations, shocks, moisture, etc.

A conventional modular structure comprises at least one frame which defines a volume in which a printed circuit board can be placed, this frame comprising two side walls fitted with fixation means, each one able to be fixed either to a closure plate, or to another frame.

This frame, which is generally moulded or machined, is difficult to produce with good tolerances. It is expensive to manufacture. It comprises a certain number of mouldings, notches and grooves, both on the inside and on the outside of its uprights and cross members. Such a modular structure in a frame is relatively heavy, expensive and less than satisfactory from the thermal point of view, the heat released by the electronic components of the printed circuit board having to be removed effectively for optimum operation. In addition, its weight is a handicap from the point of view of the on-board mass. It is not unusual, during maintenance operations on an aircraft, for it to have to be replaced in a few seconds and it must be able to be easily handled.

SUMMARY OF THE INVENTION

The object of the present invention is therefore more particularly to overcome these drawbacks especially of weight, cost and cooling.

In order to do this, the present invention proposes a modular structure, capable of receiving one or more printed circuit boards, which does not have a frame.

Such a modular structure is particularly simple to produce and to assemble. The printed circuit boards that it houses are held efficiently, while the structure remains light and easy to handle.

More specifically, the present invention relates to a modular structure for carrying printed circuit boards, capable of being connected to an electronic installation, comprising two cover plates placed opposite each other, contributing to defining a housing for at least one printed circuit board.

The cover plates engage one with the other by sandwiching, via a first edge, support means for one or more connection blocks and, via a second edge, support means for a locking mechanism, in order to hold the structure in a connected position, the support means for the connection blocks and for the locking mechanism having ends which are separate before assembly.

Preferably, the cover plates include an at least one other edge, stiffening means making it possible among other things to improve the engagement of the cover plates with each other.

The support means for the locking mechanism can take the form of at least one bar.

The support means for the connection blocks can take the form of at least one bar arranged so as to contribute to defining, when it is sandwiched between the two cover plates, one or more cavities open towards the outside of the housing and intended to receive the connection blocks. A connection block in a cavity is intended to be connected, on one side, to the printed circuit board and, on the other side, to another connection block, external to the structure and facing it.

The stiffening means may be formed by at least one portion making at least one change in direction relative to the main surface of the cover plate. A preferred embodiment is to use as stiffening means an angle bracket with two flanges, one a median flange and the other an end flange, these flanges making two changes in direction relative to the main surface of the cover plate.

The end flanges can be provided with holes for the purpose of assembling them.

In order to carry out proper internal ventilation of the housing, the median flanges can be provided with at least one opening for ventilation.

In order to be able to house bulky electronic components, without significantly increasing the size of the modular structure, the median flange of an angle bracket belonging to one of the cover plates can have a width different to that of an angle bracket belonging to the other cover plate.

In order to improve the holding and the stiffening of the printed circuit board, provision can be made for the structure to carry at least one stiffening rod. The results are improved if the stiffening rod is secured to one of the cover plates. Provision can also be made for the printed circuit board to carry at least one stiffening bar on each one of its faces.

In a modular structure with just one printed circuit board, the two stiffening rods can each be secured to one of the cover plates.

In a configuration with two stiffening rods carried by two different faces of the printed circuit board, it is not necessary for these rods to have the same length.

However, it is preferable that they have approximately the same orientation.

In the modular structures with many printed circuit boards, the cover plates sandwich at least one spacer, using the stiffening means.

In order to encourage good internal ventilation, it is preferable that the spacer be provided with at least one opening for ventilation.

One of the printed circuit boards is fixed to a spacer when the modular structure houses more than two printed circuit boards.

In order to guarantee satisfactory security when the modular structure is introduced into a rack, it is possible to include polarization means within the support means for the connection blocks.

Similarly, in order to facilitate positioning of the structure in the rack, it is possible to include positioning means on the support means for the connection blocks.

BRIEF DESCRIPTION OF THE DRAWINGS

Other characteristics and advantages of the invention will appear on reading the following description made, by way of non-limiting examples, in connection with the appended figures which show.

DESCRIPTION OF THE PREFERRED EMBODIMENTS

Figure 1A:
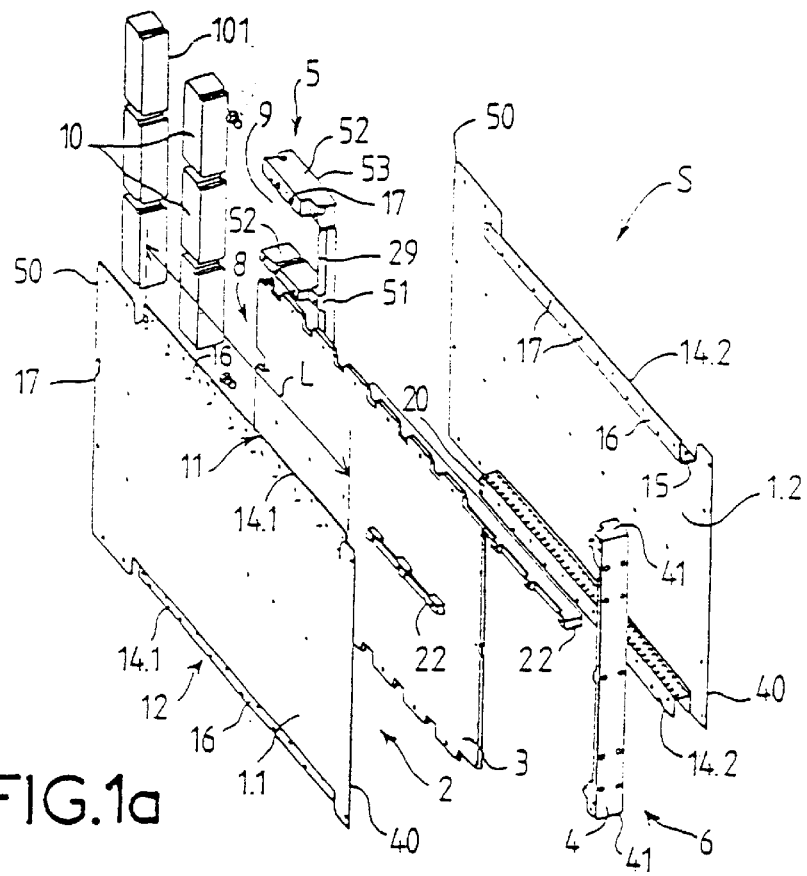
FIG. 1a, an exploded view of a modular structure according to the invention housing one printed circuit board, FIG. 1b, a rack on the inside of which there are several modular structures according to the invention, FIG. 1c, a detail of the modular structure of FIG. 1a, slid into the rack, FIG. 2, an exploded view of a modular structure according to the invention housing two printed circuit boards, FIG. 3, an exploded view of a modular structure according to the invention housing three printed circuit boards.

FIG. 1a shows an exploded view of a modular structure S according to the invention. This modular structure S has an approximately parallelepipedal shape, and it defines a housing 2 for at least one printed circuit board 3. It comprises two cover plates 1.1, 1.2 placed opposite each other, intended to engage one with the other and between which the printed circuit board 3 is placed. In the example described, the two cover plates 1.1, 1.2 are formed from approximately rectangular plates but other shapes are possible and a single printed circuit board is shown. The printed circuit board 3 lies approximately parallel to the main plane of the cover plate 1.1, 1.2.

In order to make the housing 2 for the printed circuit board 3, the two cover plates 1.1, 1.2 engage one with the other by sandwiching via a first edge 50 support means 5 for one or more connection blocks 10 for the connection and via a second edge 40 support means 4 for a locking mechanism 7 in order to hold the structure S in position connected to the electronic installation. The second edge 40 is opposite the first edge 50. The support means 5, 4 for the connection blocks and for the locking mechanism have ends 53, 41 respectively, which are separate before assembly, between the two cover plates 11, 12. The locking mechanism 7 is visible in FIGS. 2 and 3 but not in FIG. 1a. Holes 17 can be provided both on the support means 4, 5 and on the edges 40, 50 in order to allow assembly, for example by screwing the two cover plates 1.1 together, 1.2.

The support means 5, 4 for the connection blocks 10 and for the locking mechanism 7 serve to wedge the cover plates one with respect to the other. The two cover plates 11, 12 are fitted to the support means 4, 5 for the connection blocks and for the locking mechanism. They are fixed to these support means 4, 5.

Figure 1B:
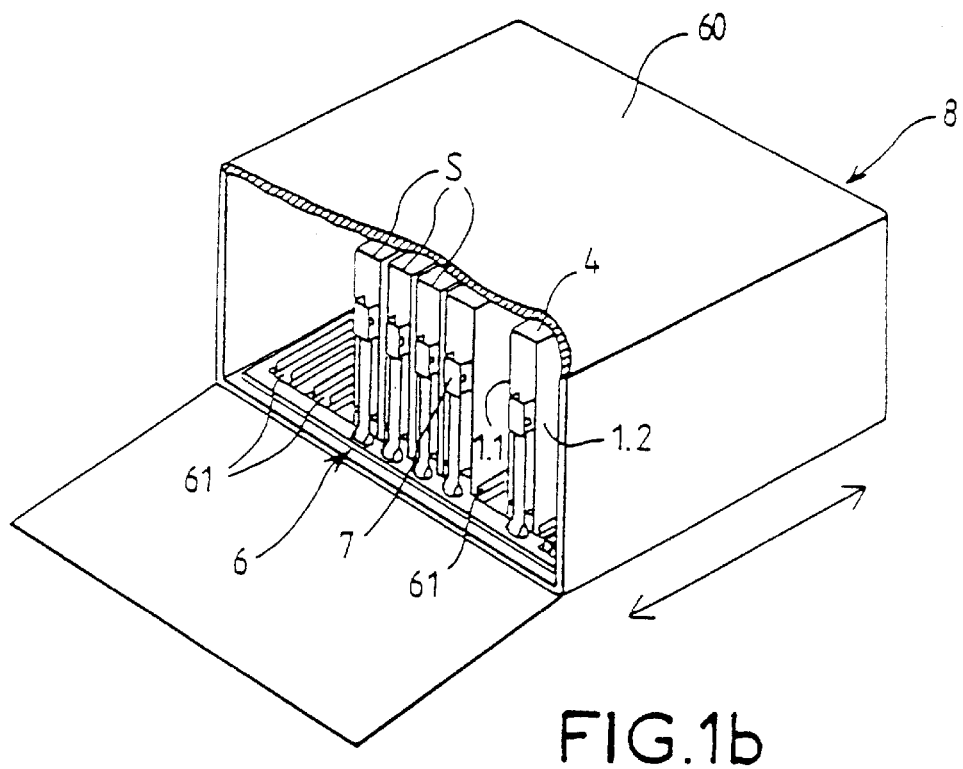

The support means 5 for the connection blocks 10 can be made by at least a first bar and the support means 4 for the locking mechanism by at least a second bar. It is conceivable to resort to components other than bars, for example connection blocks moulded as a single component can be sandwiched between the two cover plates, In FIG. 1a, the second edges 40 of the cover plates 1.1, 1.2 are located on the front face 6 of the modular structure S, which corresponds to its accessible and visible face when it is engaged in a rack 60 of an electronic installation. Such a rack 60, fitted with several modular structures S according to the invention, is shown in FIG. 1b. The locking mechanism 7 is intended, in the locked position, to hold the modular structure S under permanent pressure at the bottom of the rack 60 in order that the connection blocks 10 remain connected to other connection blocks 101 external to the structure and being placed opposite to them. In the unlocked position, the mechanism allows the structure to be extracted from the rack 60. It is possible to envisage that the modular structure S is connected to an electronic installation without it being slid, in the manner of a plug-in unit in a rack; the locking mechanism would always have a role of holding it in the connected position.

In FIG. 1a, the first edges 50 of the cover plates 1.1, 1.2 are located on the rear face 8 of the modular structure S, which corresponds to its face which is at the bottom of the rack 60. The first bar 5 is configured so as to contribute to defining, when it is sandwiched between the two cover plates 1.1, 1.2, at least one or more cavities 9 open towards the outside of the housing 2, each one intended to receive a connection block 10, shown schematically in FIG. 1a by a single rectangular parallelepiped. The printed circuit board 3 will be connected to this connection block 10. The connection to the printed circuit board 3 may be accomplished via pads 28 for surface mounting or via pins into the circuit. Surface mounting pads 28 are visible in FIG. 2.

In FIG. 1a, the first bar 5 contributes to defining three juxtaposed cavities 9. It comprises an upright 51 which follows the first edge 50 of each of the cover plates 1.1, 1.2 and to which four transverse rods 52 are fixed. This upright 51 forms the bottom of the cavities 9, whilst two successive rods 52 and the two cover plates 1.1, 1.2 form the side walls of a cavity 9. The bottom of the cavities 9 leaves a passage 29 in order to make the connection between the printed circuit board 3 and the connection blocks 10.

The connection blocks 10, which will be housed in the cavities 9, conventionally have a plurality of connection elements (not shown) oriented parallel to the direction of insertion of the modular structure S into the rack 60, this direction being shown by an arrow in FIG. 1b.

According to another characteristic of the invention, the cover plates 1.1, 1.2 each include, via at least one other edge 11, 12, stiffening means 14.1, 14.2, these stiffening means making it possible to improve the engagement of the cover plates 1.1, 1.2 with each other. These stiffening means 14.1, 14.2 can be formed by at least one portion making at least one change of direction relative to the main surface of the cover plate 1.1. In the figures, the cover plate 1.1 has an angle bracket 14.1 on each of its edges 11, 12 and the cover plate 1.2 an angle bracket 14.2 on each one of its edges 11, 12. These two edges 11, 12 are opposite each other. The length L of the angle brackets 14.1, 14.2 is at most equal to the gap separating the support means for the connection blocks and for the locking mechanism when they are sandwiched between the two cover plates 1.1, 1.2.

The angle brackets 14.1, 14.2 comprise two flanges 15, 16 which make two changes in direction relative to the main surface of the cover plate 1.1, 1.2 which carries it. In the example described, the first, median flange 15 is approximately perpendicular to the surface and the second, end flange 16 is approximately parallel.

The two cover plates 1.1, 1.2 are secured opposite each other especially by their second, end flanges 16; for this purpose, they are provided with holes 17 which makes it possible to use screws to secure them to each other. At least one of the cover plates 1.1 carries a printed circuit board 3, which can be fixed to stiffening means 14.1, 14.2, for example to the end flanges 16.

The two cover plates 1.1, 1.2 forming the modular structure S may not be identical. For this purpose it is possible to refer to FIG. 1c which shows a partial cross section of an example of a modular structure S according to the invention, level with the lower edges 12 of the cover plates 1.1, 1.2. The stiffening means 14.1 of one 1.1 of the cover plates are not identical to the stiffening means 14.2 of the other. The median flanges 15 of the angle brackets 14.1 of one cover plate 1.21 do not have the same width as the median flanges 15 of the angle brackets 14.2 of the other cover plate 1.2. The housing 2 is asymmetric with respect to the plane of the printed circuit board 3 which it contains. This asymmetry makes it possible to house printed circuit boards 3 carrying on one of their faces electronic components 21 which are higher than those carried on the other face, without leading to a modular structure S which is too bulky.

The cover plates 1.1, 1.2 are able to act as a heat sink for cooling by conduction. The electronic component 21 dissipating heat can be in direct or indirect thermal contact with the cover plates 1.1, 1.2. A direct thermal contact is made between the component 21 and the cover plate 1.1 in FIG. 1c. It will be possible to make the cover plates 1.1, 1.2 in a heat-conducting material such as, for example, copper or aluminium.

When the two cover plates 1.1, 1.2 are engaged one with the other, the gap 18 which separate [sic] them level with the housing 2 is bigger than that 19 which separates the end flanges 16 of their facing angle brackets 14.1, 14.2.

Figure 1C:
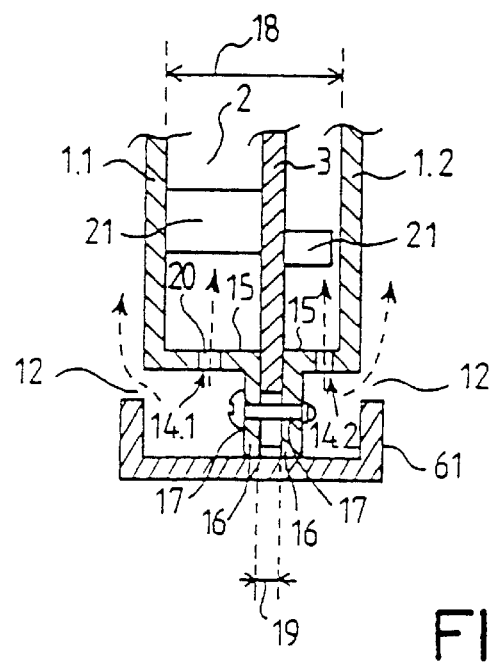

In this FIG. 1c, it is assumed that the modular structure S is housed in a rack such as that in FIG. 1b and that the angle brackets 14.1, 14.2 of each of the cover plates 1.1, 1.2, which are opposite each other, can be found in the same slideway 61 of the rack. In this case a lower slideway is shown but the same arrangement would be found at an upper slideway. The width of the slideway 61 is approximately that of the sandwich formed by the cover plates 1.1, 1.2 and the support means 5 for the connection blocks and the support means 4 for the locking mechanism. It is by these support means 4, 5 that the modular structure S is held in the slideway 61. In the configurations with bars 4, 5 it can be seen that the edge of the bars 4, 5 comes into contact with the bottom of the slideway 61. In FIG. 1b, the rack 60 is cut away in order to show the upper edge of the first bars 4 but the upper slideways are not shown in order not to overload the figure.

In FIG. 1c, the bars are not visible since the cut-away has been made in a median region of the modular structure S. At this spot, the two end flanges 16 are in contact with the slideway 61 but they do not occupy all its internal-volume.

In some applications, in an attempt to efficiently ventilate the inside of the housing 2, the median flanges 15 are provided with openings 20. During ventilation of the rack by a blown fluid injected into the slideway 61, the fluid penetrates the housing 2 through the opening 20 in order to cool the electronic components which are there and also sweeps over the outside of the modular structure S. Dotted arrows simulate the path of the fluid. Both internal and external ventilation is then possible and efficient. This both internal and external ventilation can be added to the cooling by conduction.

In the prior art with a frame, an entire cross member of the frame was located in the slideway, occupying the entire internal volume of the latter and the external ventilation was virtually non-existent. A blockage of the fluid circulation would occur at the frame cross member.

In other particular applications, it may be recommended not to directly ventilate the components 21, but only the cover plates 1.1, 1.2, which is achieved by omitting the openings 20 in the median flanges 15.

It is preferable, in order to improve the holding and the stiffening of the printed circuit board 3, to provide at least one stiffening rod 22 fixed to the printed circuit board 3. This stiffening rod 22 can also be secured to one of the cover plates 1.1, 1.2, which further improves performance in the case of vibrations, shocks or sudden accelerations.

In FIG. 1a, two stiffening rods 22 are drawn. Each one is arranged on one face of the printed circuit board 3. By providing two stiffening rods 22, each one on one face of the printed circuit board 3, the latter is firmly held in the housing 2, it is also fixed to two cover plates 1.1, 1.2. The modular structure S can then be reliably used in a harsh environment subject to vibrations, to sudden accelerations, to shocks, etc. When there are several stiffening rods 22, it is not necessary for them to have the same length. It is preferable for them to be oriented in approximately the same direction.

Because of its design, the modular structure S according to the invention is of a variable composition. Whereas FIG. 1a has a modular structure S with a single printed circuit board 3, the structure in FIG. 2 comprises two of them, 3.1, 3.2, and that in FIG. 3 comprises three of them, 3.1, 3.2, 3.3. These numbers are not limiting.

Figure 2:
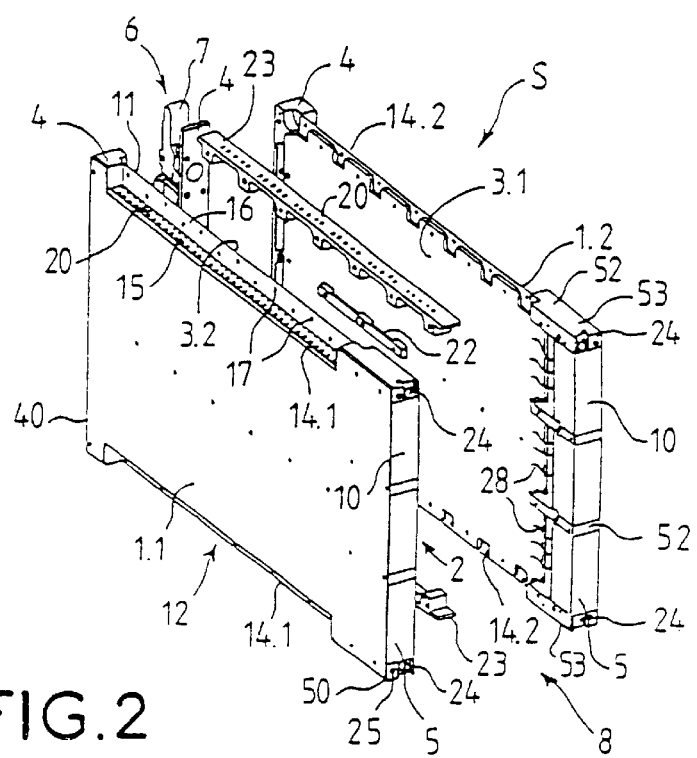

In FIG. 2, there are two cover plates 1.1, 1.2 which are similar to those of FIG. 1a. Each one 1.1, 1.2 of them carries a printed circuit board 3.1, 3.2. The two cover plates 1.1, 1.2 engage by sandwiching, via a first edge 50, two first juxtaposed bars 5 and, via a second edge 40, two second juxtaposed bars 4. In this particular configuration, the locking mechanism 7 is carried by both the second bars 4 but other configurations are possible. The first bars 5 are similar to those described in FIG. 1.

The fact of using several first and second juxtaposed bars 5, 4 makes it possible to simplify the assembly of the modular structures S in accordance with the invention by reducing the number of different parts to be supplied. The modular structures of FIGS. 2 and 3 comprise as many first bars 5 and second bars 4 as printed circuit boards 3.1, 3.2, 3.3.

Of course it would be possible to use only a single first bar and only a single second bar of a suitable thickness in order that the housing 2 can accommodate the desired number of printed circuit boards.

In the variants with several printed circuit boards 3, the cover plates 1.1, 1.2 are secured one to the other via at least one spacer 23 sandwiched between the stiffening means 4.1 [sic] of the one cover plate 1.1 and the stiffening means 14.2 of the other cover plate 1.2.

Figure 3:
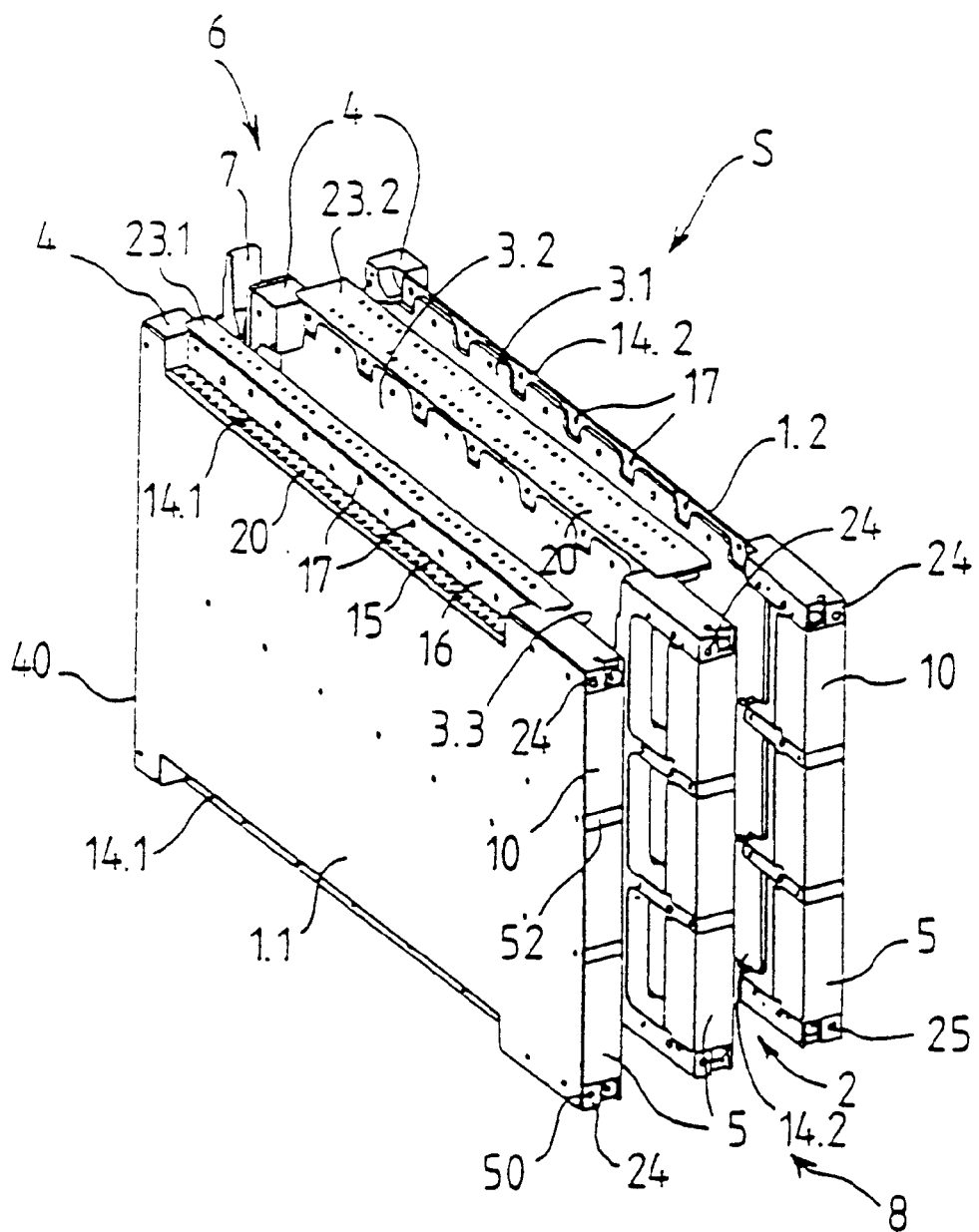

The length of this spacer 23 is approximately that of the stiffening means 14.1, 14.2. More specifically, in the example of FIG. 2, with two printed circuit boards 3.1, 3.2, the spacer 23 is fixed on one side to one of the cover plates 1.1 and on the other to the other cover plate 1.2 at the end flanges 16 of their facing angle brackets 14.1, 14.2. In FIG. 3 with three printed circuit boards 3.1, 3.2, 3.3 and two spacers 23.1, 23.2, one of the boards, 3.2, is fixed to the spacer 23.2 and each one of the cover plates 1.1, 1.2 carries a printed circuit board 3.1, 3.3 respectively.

In order to maintain proper ventilation of the inside of the housing 2, the spacer 23 is provided with at least one opening 20 for ventilation. However, it is of course possible to omit these ventilation openings if internal ventilation is not recommended. The variant in FIG. 3 with three printed circuit boards 3.1, 3.2, 3.3 shows two juxtaposed spacers 23.1, 23.2, which may have different thicknesses if the electronic components on the boards so require.

FIGS. 2 and 3 show modular structures S seen by their rear face 8. The first bars 5 are viewed end-on and they are fitted with polarization means 24 shown in the form of orifices directed towards the outside of the housing 2, each one capable of being engaged with a lug (not shown) carried by the rack 60. The orifices are located at the two ends of the first bars 5. These orifices have an outline, generally with cut faces, precluding any possibility of locking the modular structure in the rack in a place which is not allocated to it. Other polarization means can of course be envisaged without departing from the scope of the invention. Means 25 for positioning the modular structure S in the rack are also shown on the first bars 5. They are also shown in the form of orifices in which lugs (not shown) carried by the rack are housed. Other positioning means 25 are of course conceivable without departing from the scope of the invention.

What is claimed is:

1. Modular structure for carrying printed circuit boards configured to be connected to an electronic installation, comprising:

first and second cover plates positioned opposite to each other, and contributing to defining a housing for at least one printed circuit board;

wherein the first and second cover plates engage one with the other by sandwiching, along and in contact with a first edge, first support means for one or more connection blocks for the connection and by sandwiching, along and in contact with a second edge opposite the first edge, second support means including a locking mechanism to hold the structure in a connected position, the first and second support means having ends that are separate before assembly of the first and second cover plates.

2. Modular structure according to claim 1, wherein the first and second cover plates each include on at least one other edge stiffening means for securing the first and second cover plates to each other.

3. Modular structure according to claim 1, wherein the second support means for the locking mechanism has a form of at least one bar.

4. Modular structure according to claim 1, wherein the first support means for the connection blocks has a form of at least one bar configured to contribute to defining, when it is sandwiched, one or more cavities open towards an outside of the housing in order to receive the connection blocks.

5. Modular structure according to claim 4, wherein one of the connection blocks is configured to be connected, on a first one side, to the printed circuit board and, on a second opposite to the first side, to another connection block external to and facing the structure.

6. Modular structure according to claim 2, wherein the stiffening means have a form of at least one angle bracket comprising two flanges of a median flange and an end flange, the two flanges making two changes in direction relative to a main surface of the cover plate.

7. Modular structure according to claim 6, wherein the end flange is provided with holes for assembling.

8. Modular structure according to claim 6, wherein the median flange is provided with at least one opening for ventilation.

9. Modular structure according to claim 6, wherein the median flange of the angle bracket belonging to one of the cover plates has a width different from that of an angle bracket belonging to the second cover plate.

10. Modular structure according to claim 1, wherein the first cover plate carries the printed circuit board, and fastening between the first cover plate and the printed circuit board is made by an angle bracket.

11. Modular structure according to claim 1, wherein the printed circuit board carries at least one stiffening rod.

12. Modular structure according to claim 11, wherein the stiffening rod is secured to one of the first and second cover plates.

13. Modular structure according to claim 1, wherein the printed circuit board carries at least two stiffening rods including at least one stiffening rod on each face of the printed circuit board.

14. Modular structure according to claim 13, wherein the two stiffening rods carried by each respective face of the printed circuit board have different lengths.

15. Modular structure according to claim 13, wherein the two stiffening rods carried by each respective face of the printed circuit board have approximately a same orientation.

16. Modular structure according to claim 2, wherein the first and second cover plates sandwich at least one spacer between the stiffening means of the first cover plate and the stiffening means of the second cover plate, when the structure houses plural printed circuit boards.

17. Modular structure according to claim 16, wherein the at least one spacer is provided with at least one opening for ventilation.

18. Modular structure according to claim 16, wherein a printed circuit board is fixed to the at least one spacer when the modular structure houses more than two printed circuit boards.

19. Modular structure according to claim 1, wherein the support means for the connection blocks carry polarization means.

20. Modular structure according to claim 1, wherein the support means for the connection blocks carry means for positioning the connection blocks in an electronic installation rack.

* * * * *